(12) United States Patent
Kim et al.

(10) Patent No.: US 8,361,826 B2
(45) Date of Patent: Jan. 29, 2013

(54) METHOD OF MANUFACTURING A THIN FILM SOLAR CELL

(75) Inventors: Tae-Youn Kim, Seoul (KR); Won-Seo Park, Gyeonggi-do (KR); Jeong-Woo Lee, Paju-si (KR); Seong-Kee Park, Goyang-si (KR); Kyung-Jin Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 266 days.

(21) Appl. No.: 12/591,943

(22) Filed: Dec. 4, 2009

(65) Prior Publication Data

US 2010/0197072 A1     Aug. 5, 2010

(30) Foreign Application Priority Data

Jan. 30, 2009   (KR) .................. 10-2009-0007720

(51) Int. Cl.
*H01L 31/18* (2006.01)
(52) U.S. Cl. .............. 438/57; 438/72; 438/83; 438/95
(58) Field of Classification Search ............ 438/48, 438/57, 72, 73, 83–86, 95, 98
See application file for complete search history.

(56) References Cited

U.S. PATENT DOCUMENTS

| | | | | |
|---|---|---|---|---|
| 4,667,058 A | * | 5/1987 | Catalano et al. | 136/244 |
| 4,745,078 A | * | 5/1988 | Stetter et al. | 438/74 |
| 4,783,421 A | * | 11/1988 | Carlson et al. | 438/80 |
| 5,593,901 A | * | 1/1997 | Oswald et al. | 438/80 |
| 6,214,636 B1 | * | 4/2001 | Sawayama et al. | 438/57 |
| 2006/0063296 A1 | * | 3/2006 | Park et al. | 438/93 |
| 2009/0255583 A1 | * | 10/2009 | Young et al. | 136/261 |
| 2010/0059116 A1 | * | 3/2010 | Brenner et al. | 136/256 |
| 2011/0120551 A1 | * | 5/2011 | Prince et al. | 136/256 |

FOREIGN PATENT DOCUMENTS

| | | |
|---|---|---|
| JP | 61-170077 A | 7/1986 |
| JP | 62-190882 A | 8/1987 |
| JP | 63-164277 A | 7/1988 |
| JP | 02-027774 A | 1/1990 |
| JP | 05-218472 A | 8/1993 |
| JP | 08-083922 A | 3/1996 |
| JP | 2003-249673 A | 9/2003 |
| WO | WO 2008/074879 A2 | 6/2008 |

* cited by examiner

*Primary Examiner* — Savitr Mulpuri
(74) *Attorney, Agent, or Firm* — McKenna, Long and Aldridge, LLP.

(57) ABSTRACT

A method of manufacturing a thin film solar cell includes steps of preparing a substrate on which unit cells are defined, forming transparent conducive layers on the substrate and corresponding to the unit cells, respectively, the transparent conductive layers spaced apart from each other with a first separation line therebetween, forming light-absorbing layers on the transparent conductive layers and corresponding to the unit cells, respectively, the light-absorbing layers spaced apart from each other with a second separation line therebetween, forming a third separation line in each of the light-absorbing layers, the third separation line spaced apart from the second separation line, forming a reflection material layer by disposing a silk screen over the third separation line and applying a conductive paste, and forming reflection electrodes corresponding to the unit cells, respectively, by sintering the reflection material layer.

9 Claims, 10 Drawing Sheets

FIG. 5E ns of a method of manufacturing a thin film solar cell according to the present invention.

METHOD OF MANUFACTURING A THIN FILM SOLAR CELL

This application claims the benefit of Korean Patent Application No. 10-2009-0007720, filed on Jan. 30, 2009, which is hereby incorporated by reference in its entirety.

BACKGROUND OF THE INVENTION

1. Field of the Invention

The present invention relates to a thin film solar cell, and more particularly, to a method of manufacturing a thin film solar cell that prevents electrical short problems occurring in a patterning process using a laser.

2. Discussion of the Related Art

In general, solar cells are classified into various types according to a material of a light-absorbing layer. Solar cells may be categorized into silicon solar cells having silicon as a light-absorbing layer, compound thin film solar cells using $CIS(CuInSe_2)$ or CdTe, III-V group solar cells, dye-sensitized solar cells, and organic solar cells.

Among the solar cells, silicon solar cells include crystalline solar cells and amorphous thin film solar cells. Bulk-type crystalline solar cells are widely used. However, the crystalline solar cells have increasing production costs due to expensive silicon substances and complicated manufacturing processes.

Recently, by forming a solar cell of a thin film type on a relatively low cost substrate, such as glass, metal or plastic, instead of a silicon wafer, researches for reducing the production costs have been made.

A thin film solar cell according to the related art will be explained hereinafter with reference to accompanying drawings.

Figure 1:
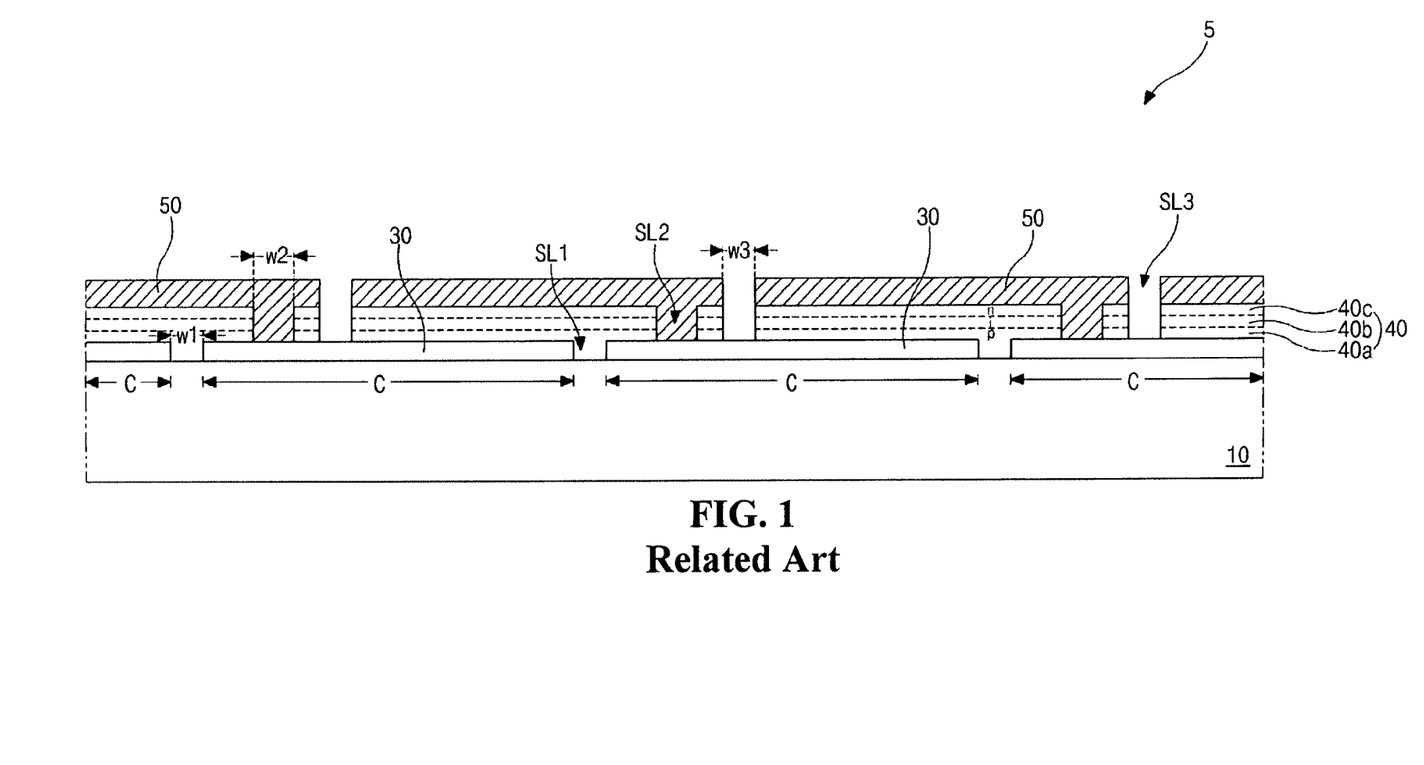
FIG. 1 is a cross-sectional view of a thin film solar cell according to the related art.

FIG. 1 is a cross-sectional view of a thin film solar cell according to the related art. In FIG. 1, the related art thin film solar cell 5 includes a substrate 10 of glass or plastic. A transparent conductive layer 30 is formed on the substrate 10 at each of unit cells C. A light-absorbing layer 40, which sequentially includes a p-type amorphous silicon layer 40a, an i-type amorphous silicon layer 40b and an n-type amorphous silicon layer 40c, is formed on the transparent conductive layer 30. A reflection electrode 50 is formed on the light-absorbing layer 40 at each of the unit cells C.

Although not shown in the figure, the substrate 10 including the transparent conductive layer 30, the light-absorbing layer 40 and the reflection electrode 50 thereon may face and be attached with a counter substrate, on which a polymeric material layer and an adhesive layer are sequentially formed.

Here, the reflection electrode 50 is formed of one selected from a conductive material group including a material that has relatively high reflectance, such as aluminum (Al) and silver (Ag). The reflection electrode 50 maximizes scattering properties of light passing through the light-absorbing layer 40.

In the thin film solar cell 5, light incident on the first substrate 10 passes through the first substrate 10 and the p-type silicon layer 40a and is absorbed by the i-type silicon layer 40b. Electrons and holes are generated in the i-type silicon layer 40b due to the light having a larger energy than a band gap energy of silicon. The electrons and the holes in the i-type silicon layer 40b are diffused to the p-type silicon layer 40a and the n-type silicon layer 40c, respectively, due to an internal electric field and are provided to an external circuit through the transparent conductive electrode 30 and the reflection electrode 50, respectively. According to this, solar energy can be converted into electrical energy.

A method of manufacturing a thin film solar cell will be explained hereinafter in more detail with reference to accompanying drawings.

FIGS. 2A to 2E are cross-sectional views of illustrating a thin film solar cell in steps of a method of manufacturing the same according to the related art.

Figure 2A:
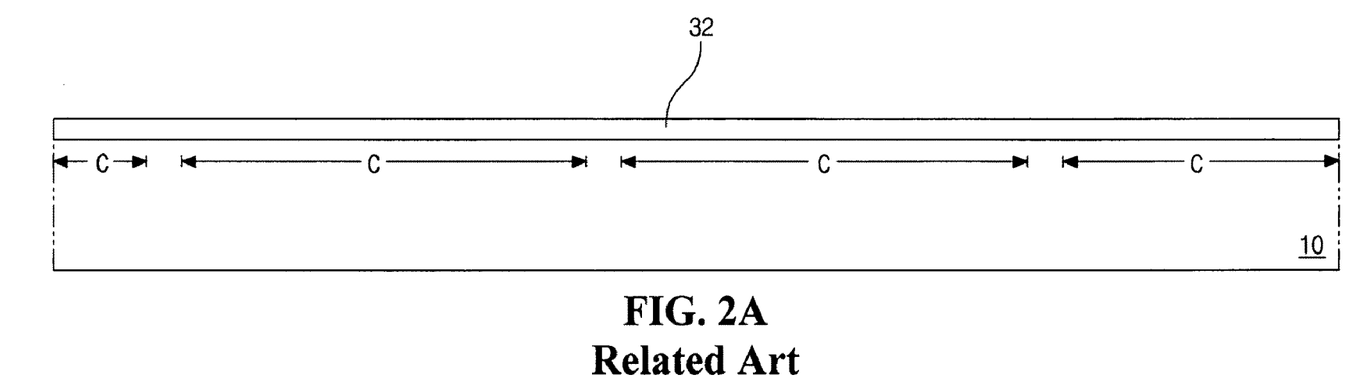
FIGS. 2A to 2E are cross-sectional views of illustrating a thin film solar cell in steps of a method of manufacturing the same according to the related art.

In FIG. 2A, unit cells C are defined on a substrate 10 of glass or plastic. A first transparent conductive material layer 32 is formed on the substrate 10 by depositing one selected from a transparent conductive material group including oxide. The transparent conductive material group may include indium tin oxide (ITO), tin oxide (SnOx) and zinc oxide (ZnOx). The first transparent conductive material layer 32, beneficially, has a thickness larger than 5,000 Å. The first transparent conductive material layer 32 may be formed by a sputtering method. The first transparent conductive material layer 32 may be formed by a spraying method. Namely, the first transparent conductive material layer 32 may be applied or printed on the substrate 10 by spraying or injecting a sol-gel solution including a transparent conductive oxide material.

Figure 2B:
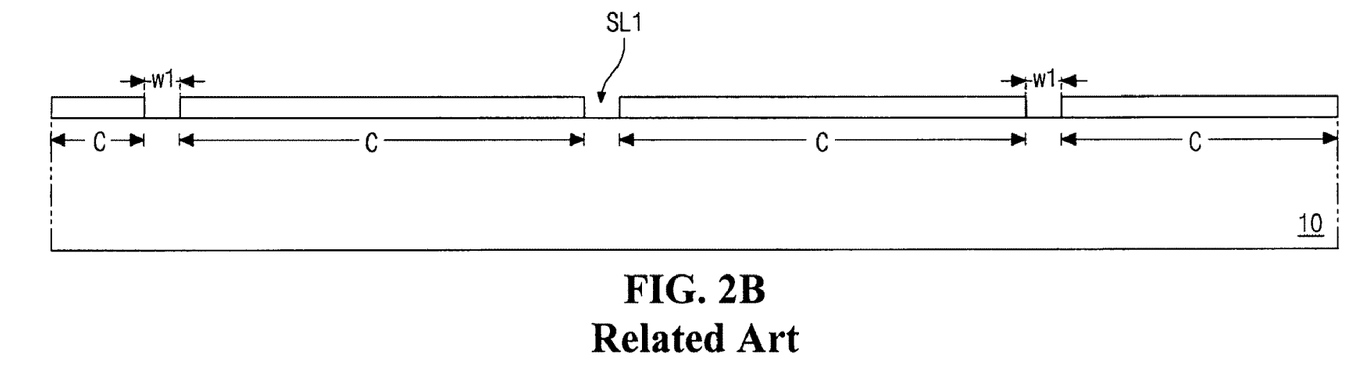

In FIG. 2B, a first laser processing apparatus (not shown) is disposed over the substrate 10 including the transparent conductive material layer 32 of FIG. 2A. The transparent conductive material layer 32 of FIG. 2A is patterned by a first laser cutting process using the first laser processing apparatus, and transparent conductive layers 30 are formed in the unit cells C, respectively. The transparent conductive layers 30 are spaced apart from each other with a constant distance therebetween due to a first separation line SL1 having a first width w1. A laser beam of the first laser processing apparatus, beneficially, has a wavelength of 1064 nm. After the first laser cutting process, the substrate 10 is exposed to correspond to a space between adjacent transparent conductive layers 30, that is, the first separation line SL1.

Figure 2C:
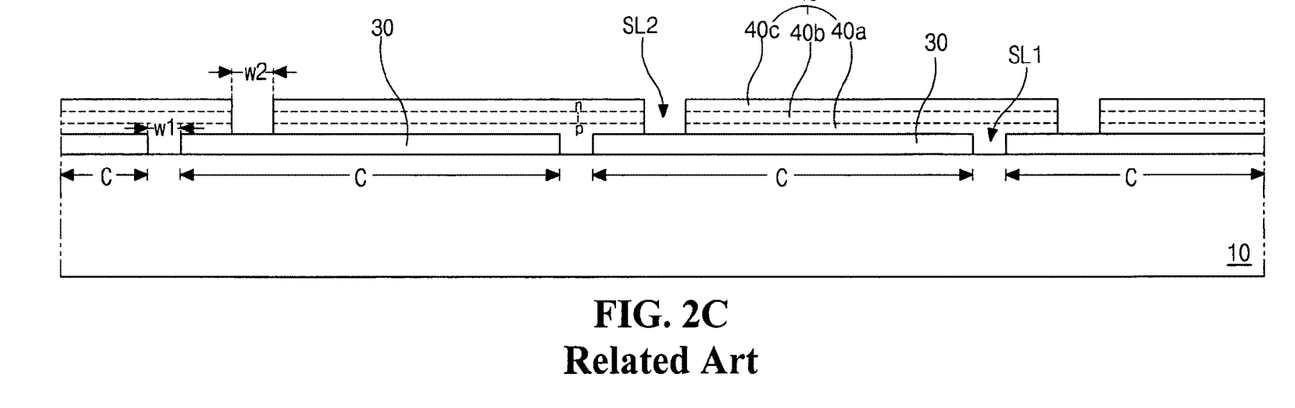

In FIG. 2C, a light-absorbing material layer (not shown) having a p-i-n structure is formed on the substrate 10 including the transparent conductive layers 30 by sequentially depositing a p-type silicon layer 40a, an i-type silicon layer 40b and an n-type silicon layer 40c.

Next, a second laser processing apparatus (not show) is disposed over the substrate 10 including the light-absorbing material layer. The light-absorbing material layer is patterned by a second laser cutting process using the second laser processing apparatus, and light-absorbing layers 40 are formed in the unit cells C, respectively. The light-absorbing layers 40 are spaced apart from each other due to a second separation line SL2 having a second width w2. The second separation line SL2 is dislocated with the first separation line SL1. It is desirable that a laser beam of the second laser processing apparatus has a wavelength of 532 nm.

Figure 2D:
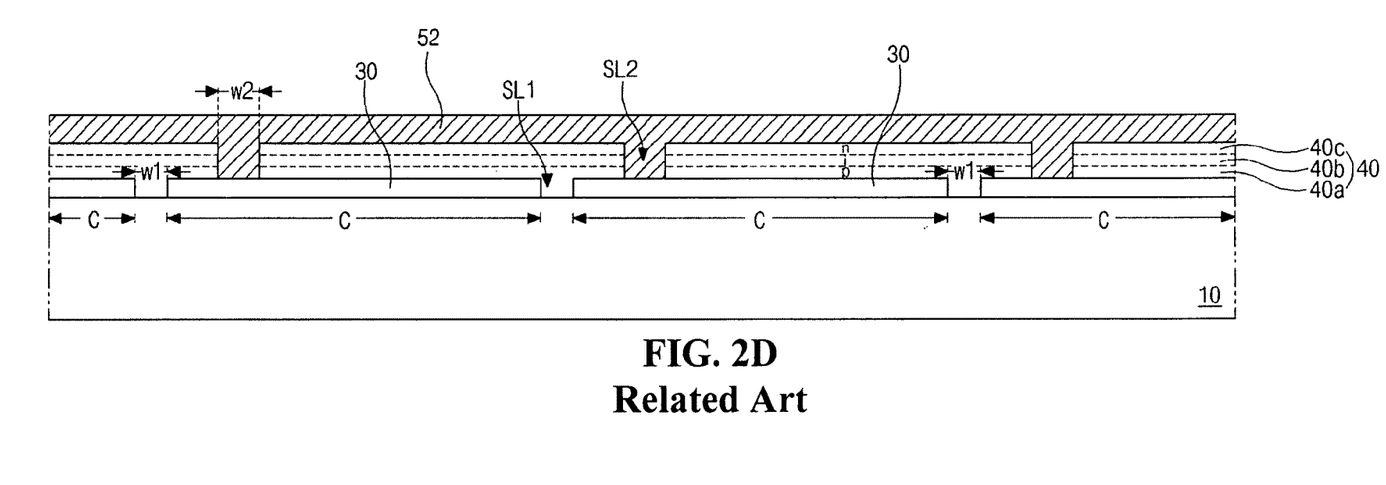

In FIG. 2D, a reflection material layer 52 is formed on the substrate 10 including the light-absorbing layers 40 by depositing one selected from a conductive material group including aluminum (Al) and silver (Ag) that have a relatively high reflectance. The reflection material layer 52 may be deposited by a sputtering method.

Figure 2E:
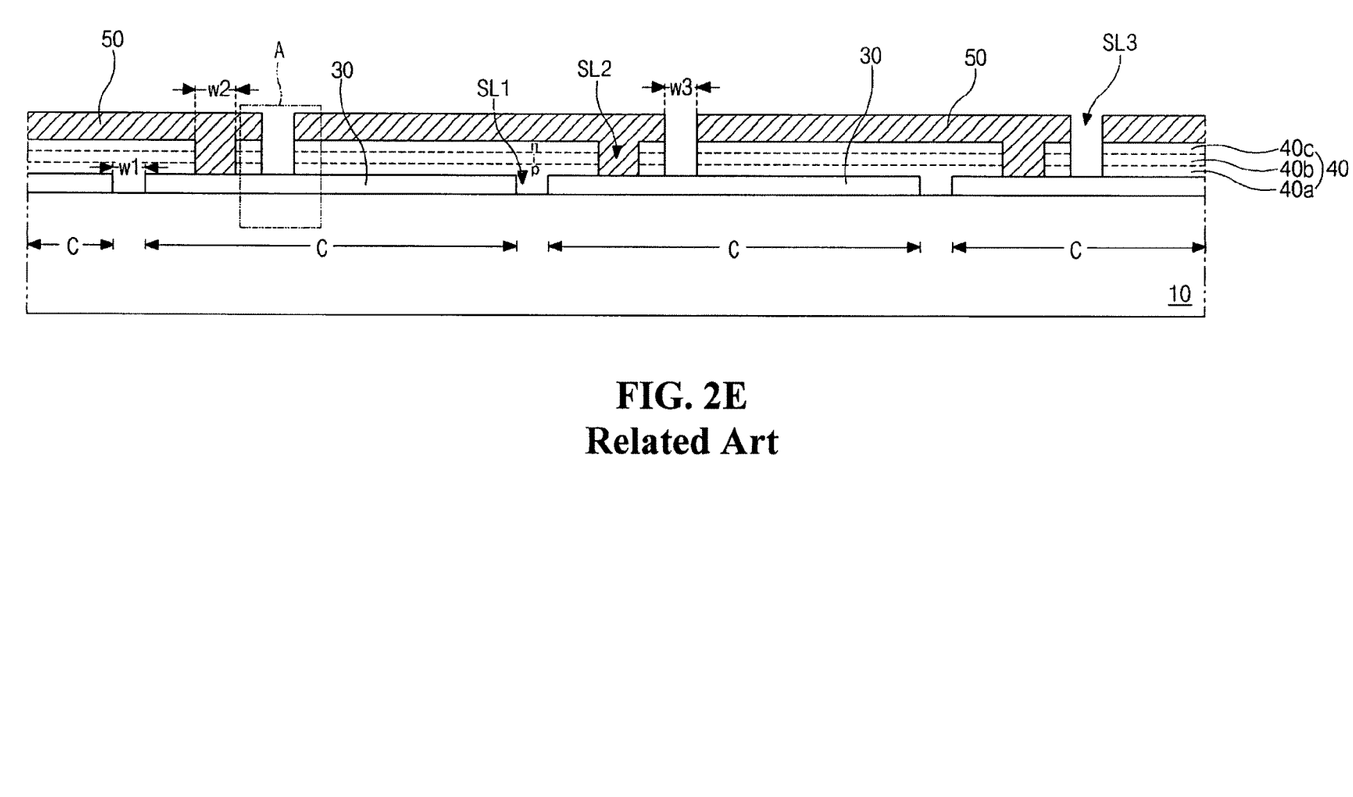

In FIG. 2E, a third laser processing apparatus (not snow) is disposed over the substrate 10 including the reflection material layer 52 of FIG. 2D. The reflection material layer 52 of FIG. 2D is patterned by a third laser cutting process using the third laser processing apparatus, and reflection electrodes 50 are formed to correspond to the unit cells C, respectively. The reflection electrodes 50 are spaced apart from each other with a constant distance therebetween due to a third separation line SL3 having a third width w3. The third separation line SL3 is dislocated with the first and second separation lines SL1 and SL2. A laser beam of the third laser processing apparatus, desirably, has a wavelength of 532 nm. At this time, the light-absorbing layers 40 under the reflection material layer 52 of FIG. 2D are also patterned by the third laser cutting process. The transparent conductive layer 30 is exposed to correspond to the third separation line SL3.

Although not shown in the figure, when the third laser cutting process is performed, the cutting between adjacent unit cells C is not perfectly made in a periphery of the substrate 10 because the laser is unfocused. To solve the problem, a fourth laser cutting process may be carried out along a direction perpendicularly crossing a direction of the third laser cutting process. The reflection material layer 50, the light-absorbing layer 40 and the transparent conductive layer 30 are cut through the fourth laser cutting process, and a portion in the periphery of the substrate 10 can be isolated. Here, a laser beam of the fourth laser cutting process may have a wavelength of 532 nm or 1064 nm.

Accordingly, the related art thin film solar cell can be manufactured.

In the thin film solar cell 5, since the light-absorbing layer 40 is formed of a silicon material having a melting point of more than 1000 degrees of Celsius, the reflection electrode 50 is formed of one selected from a conductive material group including aluminum and silver that have a relatively low melting point, for example, 660 degrees of Celsius.

The third laser cutting process is to cut the light-absorbing layers 40 and the reflection material layer 52 at a time. When the laser beam is irradiated, instant heats can be produced. The heats are carried to the reflection material layer 52, and the reflection material layer 52 may be melted. Accordingly, the reflection electrodes 50 and the transparent conductive layers 30 may be electrically connected to each other, and energy conversion efficiency may be lowered due to electrical short.

Figure 3A:
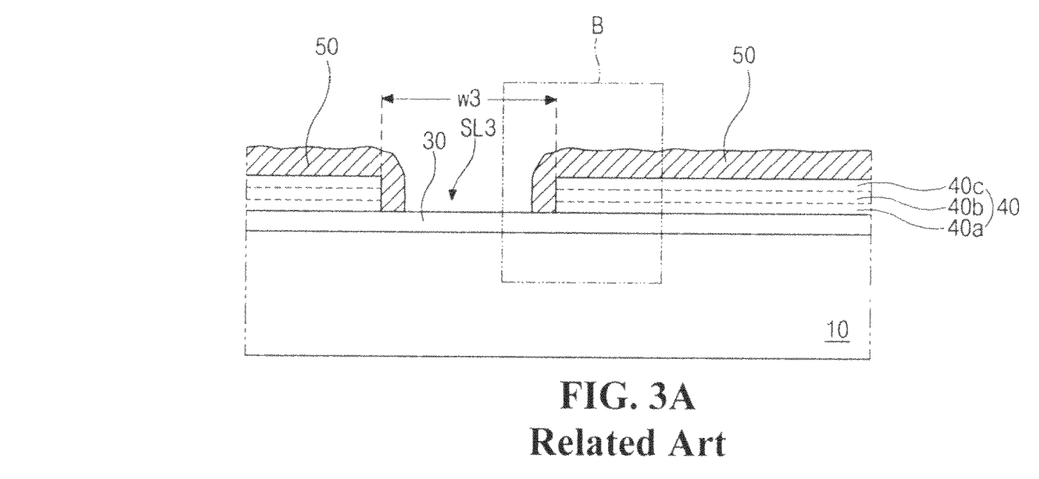
FIG. 3A is a view of enlarging the area A of FIG. 2E.
Figure 3B:
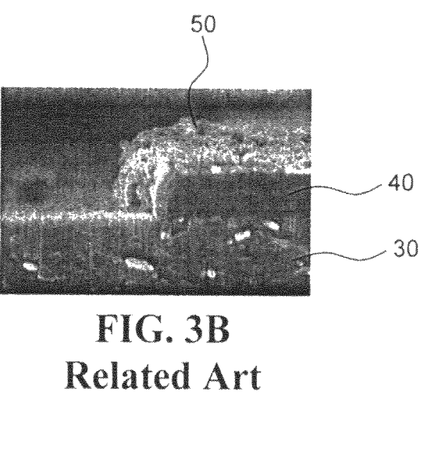
FIG. 3B is a picture of showing the area B of FIG. 3A.

FIG. 3A is a view of enlarging the area A of FIG. 2E, and FIG. 3B is a picture of showing the area B of FIG. 3A.

In FIGS. 3A and 3B, the transparent conductive layer 30 and the light-absorbing layer 40 are formed in each unit cell C of FIG. 2E. The reflection electrodes 50 are formed on the transparent conductive layer 30 and the light-absorbing layer 40 and are spaced apart from each other by the third separation line SL3.

When the reflection material layer 52 of FIG. 2D and the light-absorbing layers 40 are cut together using the laser, the reflection material layer 52 of FIG. 2D is melted by heats due to irradiation of the laser beam, and there occurs electrical short between the reflection electrodes 50 and the transparent conductive layer 30 in the third separation line SL3. The electrical short rapidly decreases the energy conversion efficiency of the thin film solar cell.

More particularly, in the thin film solar cell including the light-absorbing layers 40 that are divided by the respective unit cells, the unit cells may be connected not in series but in parallel due to the electrical short, or the electrons and holes generated in the light-absorbing layers 40 may be reunited to decrease the concentration of carriers. Accordingly, the energy conversion efficiency is sharply impeded.

SUMMARY OF THE INVENTION

Accordingly, the present invention is directed to a method of manufacturing a thin film solar cell that substantially obviates one or more of the problems due to limitations and disadvantages of the related art.

An object of the present invention is to provide a method of manufacturing a thin film solar cell that solves the electrical short and improves the energy conversion efficiency.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a thin film solar cell includes steps of preparing a substrate on which unit cells are defined, forming transparent conducive layers on the substrate and corresponding to the unit cells, respectively, the transparent conductive layers spaced apart from each other with a first separation line therebetween, forming light-absorbing layers on the transparent conductive layers and corresponding to the unit cells, respectively, the light-absorbing layers spaced apart from each other with a second separation line therebetween, forming a third separation line in each of the light-absorbing layers, the third separation line spaced apart from the second separation line, forming a reflection material layer by disposing a silk screen over the third separation line and applying a conductive paste, and forming reflection electrodes corresponding to the unit cells, respectively, by sintering the reflection material layer.

In another aspect, a method of manufacturing a thin film solar cell includes steps of preparing a substrate on which unit cells are defined, forming transparent conducive layers on the substrate and corresponding to the unit cells, respectively, the transparent conductive layers spaced apart from each other with a first separation line therebetween, forming light-absorbing layers on the transparent conductive layers and corresponding to the unit cells, respectively, the light-absorbing layers spaced apart from each other with a second separation line therebetween, forming a third separation line in each of the light-absorbing layers, the third separation line spaced apart from the second separation line, forming a reflection material layer by disposing a silk screen over the third separation line and selectively dropping a liquid conductive material using a syringe; and forming reflection electrodes corresponding to the unit cells, respectively, by sintering the reflection material layer.

In another aspect, a method of manufacturing a thin film solar cell includes steps of preparing a substrate including first and second unit cells, forming first and second transparent conducive layers on the substrate and corresponding to the first and second unit cells, respectively, the first and second transparent conductive layers spaced apart from each other, forming first and second light-absorbing layers on the first and second transparent conductive layers and corresponding to the first and second unit cells, respectively, the first and second light-absorbing layers spaced apart from each other, forming a separation line in each of the first and second light-absorbing layers; and, disposing a silk screen over the separation line and forming first and second reflection electrodes corresponding to the first and second unit cells, respectively, wherein the first and second reflection electrodes are spaced apart from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

A first embodiment of the present invention will be described with reference to FIGS. 4A to 4E. In the first embodiment, a reflection electrode is formed by a screen printing method.

FIGS. 4A to 4E are cross-sectional views of illustrating a thin film solar cell in steps of a method of manufacturing the same according to the first embodiment of the present invention.

Figure 4A:
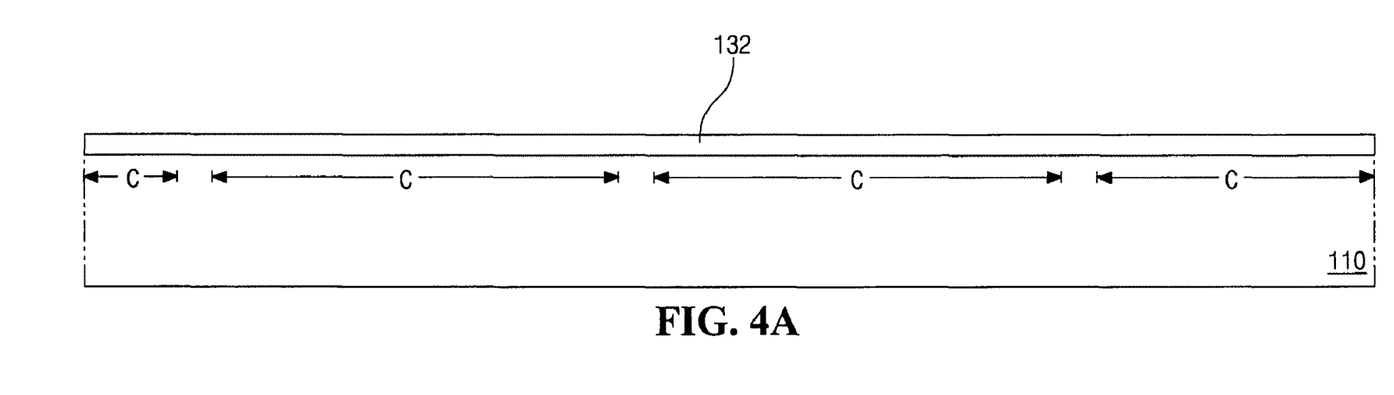
FIGS. 4A to 4E are cross-sectional views of illustrating a thin film solar cell in steps of a method of manufacturing the same according to a first embodiment of the present invention.

In FIG. 4A, unit cells C are defined on a substrate 110 of glass or plastic. A first transparent conductive material layer 132 is formed on the substrate 110 by depositing one selected from a transparent conductive material group including oxide. The transparent conductive material group may include indium tin oxide (ITO), tin oxide (SnOx) and zinc oxide (ZnOx). The first transparent conductive material layer 132, beneficially, has a thickness larger than 5,000 Å. The first transparent conductive material layer 132 may be formed by a sputtering method. The first transparent conductive material layer 132 may be formed by a spraying method. Namely, the first transparent conductive material layer 132 may be directly applied or printed on the substrate 120 by spraying or injecting a sol-gel solution including a transparent conductive oxide material.

Figure 4B:
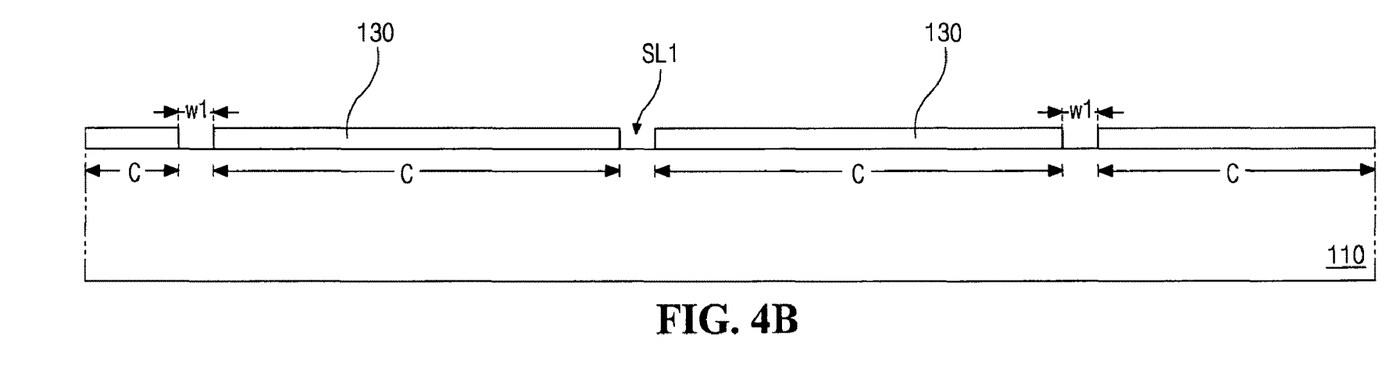

In FIG. 4B, a first laser processing apparatus (not shown) is disposed over the substrate 110 including the transparent conductive material layer 132 of FIG. 4A. The transparent conductive material layer 132 of FIG. 4A is patterned by a first laser cutting process using the first laser processing apparatus, and transparent conductive layers 130 are formed in the unit cells C, respectively. The transparent conductive layers 130 are spaced apart from each other with a constant distance therebetween due to a first separation line SL1 having a first width w1. A laser beam of the first laser processing apparatus, beneficially, has a wavelength of 1064 nm. After the first laser cutting process, the substrate 110 is exposed to correspond to a space between adjacent transparent conductive layers 130, that is, the first separation line SL1.

Figure 4C:
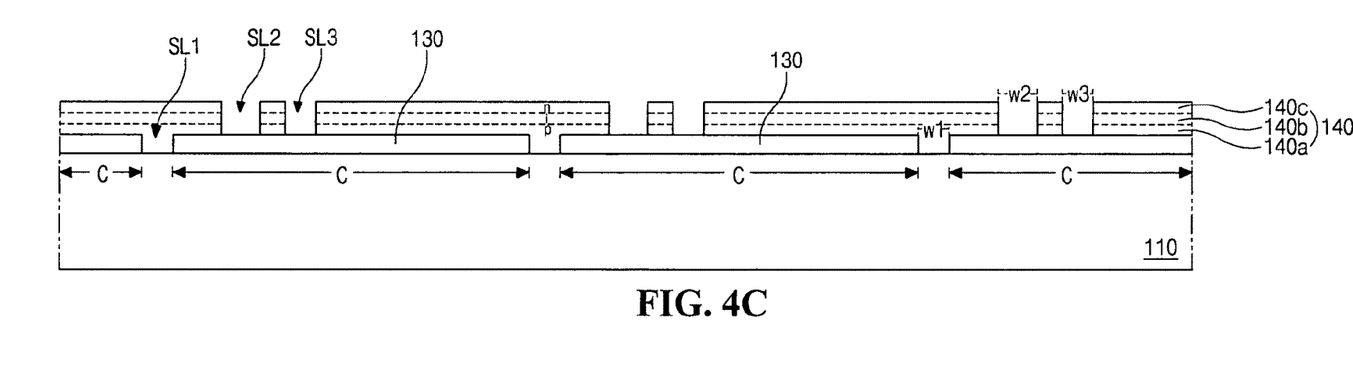

In FIG. 4C, a light-absorbing material layer (not shown) having a p-i-n structure is formed on the substrate 110 including the transparent conductive layers 130 by sequentially depositing a p-type silicon layer 140a, an i-type silicon layer 140b and an n-type silicon layer 140c.

Next, a second laser processing apparatus (not show) is disposed over the substrate 110 including the light-absorbing material layer. The light-absorbing material layer is patterned by a second laser cutting process using the second laser processing apparatus, and light-absorbing layers 140 are formed in the unit cells C, respectively. The light-absorbing layers 140 are spaced apart from each other due to a second separation line SL2 having a second width w2. The second separation line SL2 is dislocated with the first separation line SL1. It is desirable that a laser beam of the second laser processing apparatus has a wavelength of 532 nm.

Then, a third laser processing apparatus (not snow) is disposed over the substrate 110 including the light-absorbing layers 140 having the second separation line SL2. The light-absorbing layers 140 are patterned by a third laser cutting process using the third laser processing apparatus, and the light-absorbing layer 140 in each unit cell C is partially removed to thereby form a third separation line SL3 having a third width w3, which is spaced apart from the second separation line SL2. The third separation line SL3 is dislocated with the first separation line SL1.

Figure 4D:
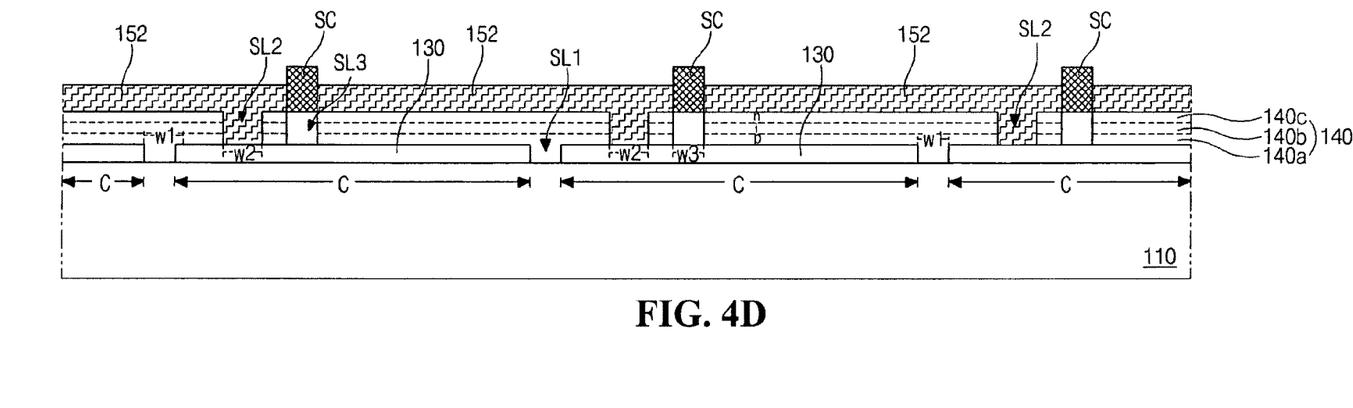

In FIG. 4D, silk screens SC are disposed over the light-absorbing layers 140 having the second and third separation lines SL2 and SL3 such that each silk screen SC corresponds to the third separation line SL3, and a reflection material layer 152 is formed on the light-absorbing layers 140 by applying one selected from conductive pastes including aluminum (Al), silver (Ag), copper (Cu), molybdenum (Mo), titanium (Ti) and cadmium (Cd). Here, conductive pastes may include a binder of a carbonic polymer to obtain viscosity.

The conductive paste may be forced in by a squeeze (not shown) and may be uniformly applied to a substantially entire surface of the substrate 110 excluding silk screens SC. The reflection material layer 152, beneficially, may have viscosity within a range of 500 cp to 50,000 cp. It is desirable that the third width w3 of the third separation line SL3 is within a range of 20 micrometers to 100 micrometers.

The reflection material layer 152 is sintered under temperatures of 200 to 500 degrees of Celsius, and the binder of the carbonic polymer may be removed.

Figure 4E:
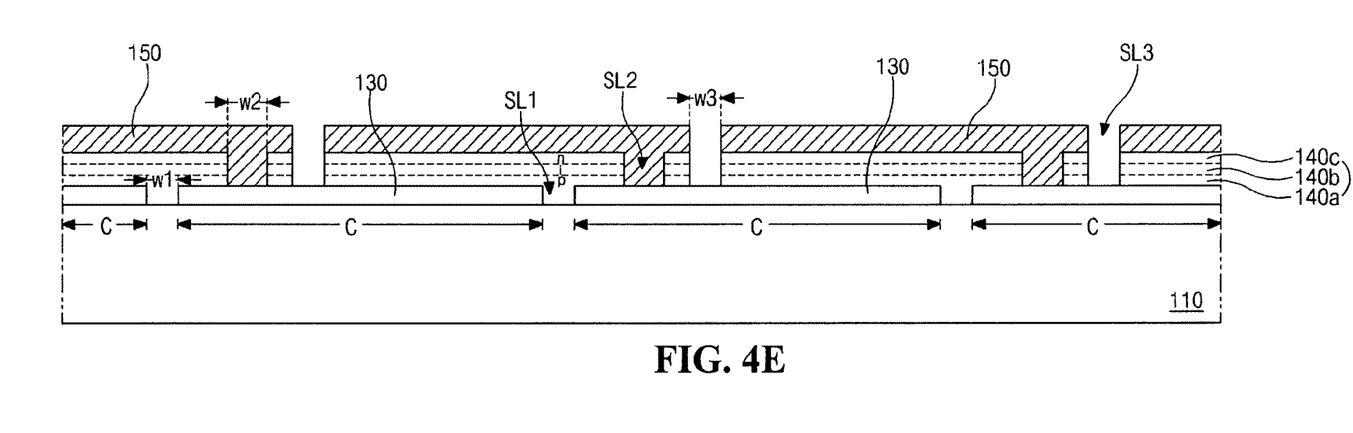

In FIG. 4E, after the sintering process, reflection electrodes 150 are formed to corresponding to the unit cells C excluding the third separation lines SL3, respectively. The reflection electrodes 150 may include one of aluminum, silver, copper, molybdenum, titanium and cadmium.

In the first embodiment of the present invention, the reflection electrodes 150 can be selectively formed by the screen printing method instead of a laser cutting process. Namely, the laser cutting process is not performed, and separation for the reflection electrodes 150 can be carried out under relatively low temperatures as compared with the laser cutting process. An electrical short between the reflection electrodes 150 and the transparent conductive layers 130 can be prevented, and the energy conversion efficiency of the thin film solar cell can be improved.

In addition, the process is performed by applying a metallic material having a paste state. The process can be simplified as compared with a deposition process using a vacuum chamber. Therefore, the productivity can be increased.

A second embodiment of the present invention will be described with reference to FIGS. 5A to 5E. In the second embodiment, a reflection electrode is formed by an inkjet printing method.

FIGS. 5A to 5E are cross-sectional views of illustrating a thin film solar cell in steps of a method of manufacturing the same according to the second embodiment of the present invention.

Figure 5A:
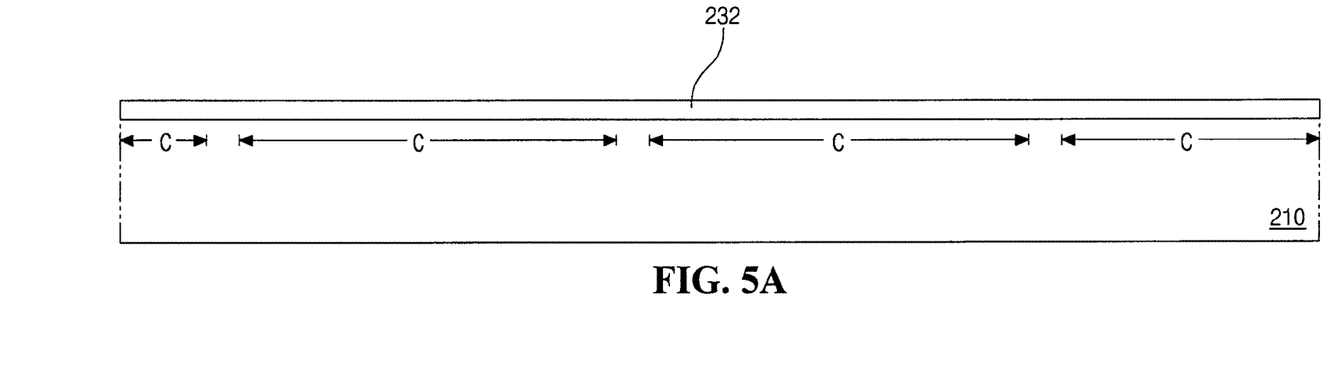
FIGS. 5A to 5E are cross-sectional views of illustrating a thin film solar cell in steps of a method of manufacturing the same according to a second embodiment of the present invention.

In FIG. 5A, unit cells C are defined on a substrate 210 of glass or plastic. A first transparent conductive material layer 232 is formed on the substrate 210 by depositing one selected from a transparent conductive material group including oxide. The transparent conductive material group may include indium tin oxide (ITO), tin oxide (SnOx) and zinc oxide (ZnOx). The first transparent conductive material layer 232, beneficially, has a thickness larger than 5,000 Å. The first transparent conductive material layer 232 may be formed by a sputtering method. The first transparent conductive material layer 232 may be formed by a spraying method. Namely, the first transparent conductive material layer 232 may be directly applied or printed on the substrate 210 by spraying or injecting a sol-gel solution including a transparent conductive oxide material.

Figure 5B:
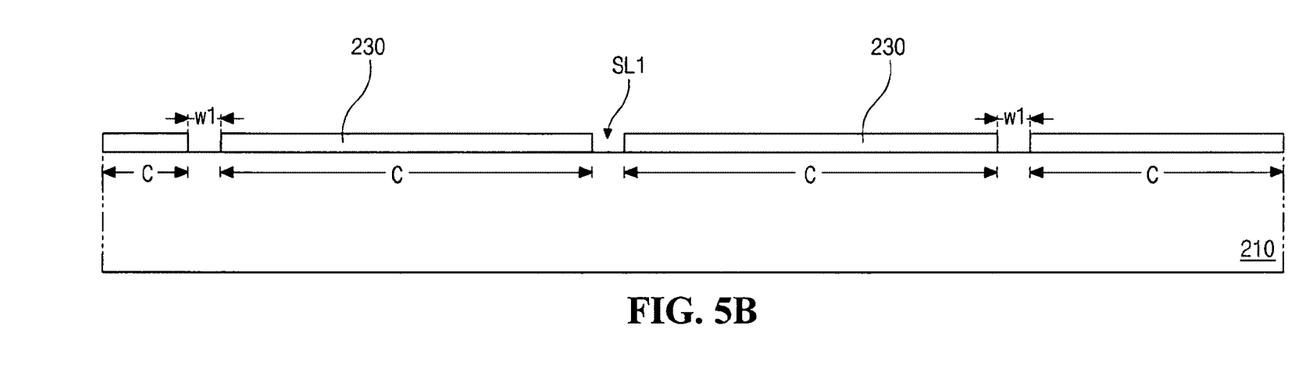

In FIG. 5B, a first laser processing apparatus (not shown) is disposed over the substrate 210 including the transparent conductive material layer 232 of FIG. 5A. The transparent conductive material layer 232 of FIG. 5A is patterned by a first laser cutting process using the first laser processing apparatus, and transparent conductive layers 230 are formed in the unit cells C, respectively. The transparent conductive layers 230 are spaced apart from each other with a constant distance therebetween due to a first separation line SL1 having a first width w1. A laser beam of the first laser processing apparatus, beneficially, has a wavelength of 1064 nm. After the first laser cutting process, the substrate 210 is exposed to correspond to a space between adjacent transparent conductive layers 230, that is, the first separation line SL1.

Figure 5C:
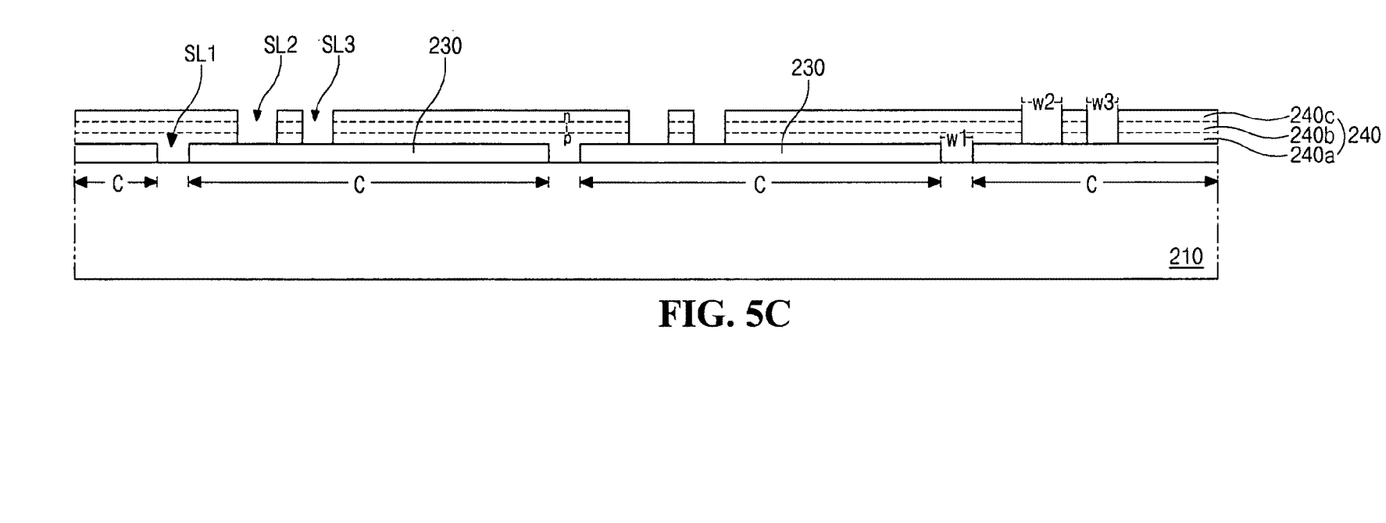

In FIG. 5C, a light-absorbing material layer (not shown) having a p-i-n structure is formed on the substrate 210 including the transparent conductive layers 230 by sequentially depositing a p-type silicon layer 240a, an i-type silicon layer 240b and an n-type silicon layer 240c.

Next, a second laser processing apparatus (not show) is disposed over the substrate 210 including the light-absorbing material layer. The light-absorbing material layer is patterned by a second laser cutting process using the second laser processing apparatus, and light-absorbing layers 240 are formed in the unit cells C, respectively. The light-absorbing layers 240 are spaced apart from each other due to a second separation line SL2 having a second width w2. The second separation line SL2 is dislocated with the first separation line SL1. It is desirable that a laser beam of the second laser processing apparatus has a wavelength of 532 nm.

Then, a third laser processing apparatus (not snow) is disposed over the substrate 210 including the light-absorbing layers 240 having the second separation line SL2. The light-absorbing layers 240 are patterned by a third laser cutting process using the third laser processing apparatus, and the light-absorbing layer 240 in each unit cell C is partially removed to thereby form a third separation line SL3 having a third width w3, which is spaced apart from the second separation line SL2. The third separation line SL3 is dislocated with the first separation line SL1.

Figure 5D:
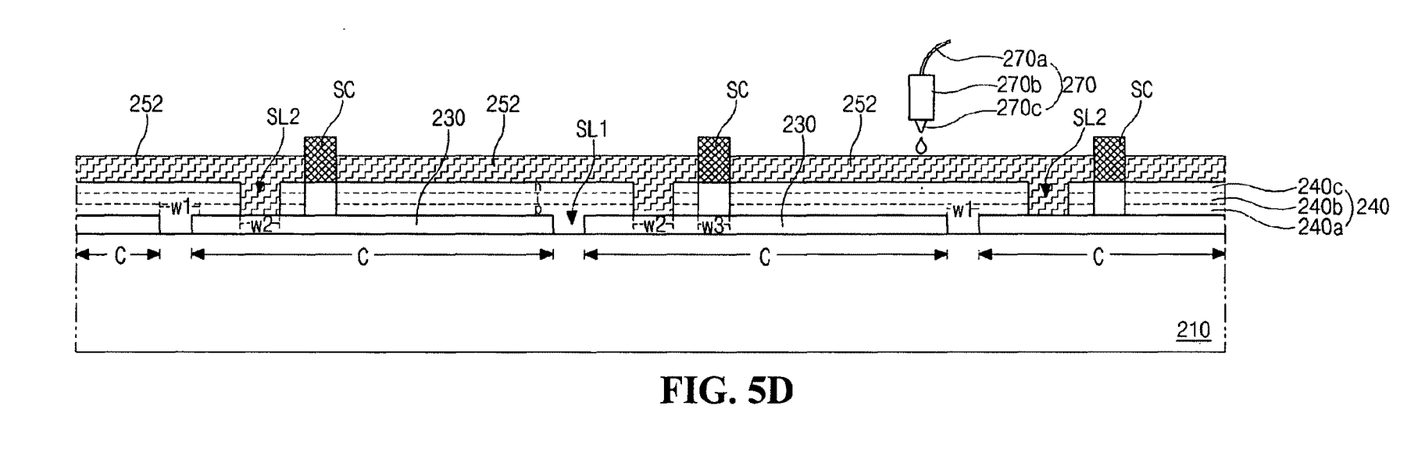

In FIG. 5D, silk screens SC are disposed over the light-absorbing layers 240 having the second and third separation lines SL2 and SL3 such that each silk screen SC corresponds to the third separation line SL3, and a reflection material layer 252 is formed on the light-absorbing layers 240 by selectively dropping one selected from liquid conductive materials including aluminum (Al), silver (Ag), copper (Cu), molybdenum (Mo), titanium (Ti) and cadmium (Cd) using an injecting apparatus 270. Here, liquid conductive materials may include a dispersion agent of a carbonic polymer.

The injecting apparatus 270 includes a supply pipe 270a supplied with a liquid conductive material from a storage tank (not shown), a syringe 270b temporarily storing the liquid conductive material from the supply pipe 270a, and a nozzle 270c appropriately injecting the liquid conductive material from the syringe 270b.

In the dropping process using the injecting apparatus 270, the reflection material layer 252 is selectively formed in the unit cells C by uniformly dropping the liquid conductive material on a substantially entire surface of the substrate 210 excluding the silk screens SC using the syringe 270b. The reflection material layer 252, beneficially, may have viscosity within a range of 1 cp to 30 cp. It is desirable that the third width w3 of the third separation line SL3 is within a range of 20 micrometers to 100 micrometers.

The reflection material layer 252 is sintered under temperatures of 200 to 500 degrees of Celsius, and the dispersion agent of the carbonic polymer may be removed.

Figure 5E:
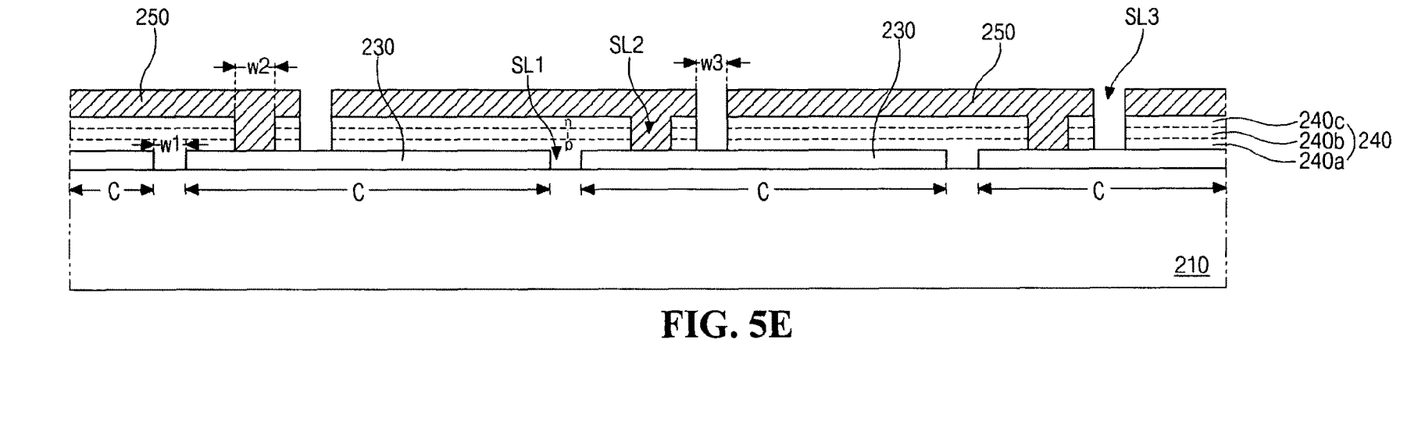

In FIG. 5E, after the sintering process, reflection electrodes 250 are formed to corresponding to the unit cells C excluding the third separation lines SL3, respectively. The reflection electrodes 250 may include one of aluminum (Al), silver (Ag), copper (Cu), molybdenum (Mo), titanium (Ti) and cadmium (Cd).

In the second embodiment of the present invention, the reflection electrodes 250 can be selectively formed by the inkjet printing method instead of a laser cutting process. Namely, the laser cutting process is not performed, and separation for the reflection electrodes 250 can be carried out under relatively low temperatures as compared with the laser cutting process. An electrical short between the reflection electrodes 250 and the transparent conductive layers 230 can be prevented, and the energy conversion efficiency of the thin film solar cell can be improved.

In addition, since the process is performed by dropping a liquid metallic material, the process can be simplified as compared with a deposition process using a vacuum chamber. Therefore, the productivity can be increased.

In the embodiments of the present invention, the thin film solar cell has a signal junction structure. The present invention can be applied to a thin film solar cell having a tandem structure or a triple structure.

In the present invention, the reflection electrode is formed by the screen printing method or the inkjet printing method, and the electrical short between the reflection electrode and the transparent conductive electrode can be prevented. Accordingly, the energy conversion efficiency of the thin film solar cell can be improved. Furthermore, the deposition process can be omitted, and the manufacturing processes can be simplified.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film solar cell, comprising:
   preparing a substrate on which unit cells are defined;
   forming transparent conductive layers on the substrate and corresponding to the unit cells, respectively, the transparent conductive layers spaced apart from each other with a first separation line therebetween;

forming light-absorbing layers on the transparent conductive layers and corresponding to the unit cells, respectively, the light-absorbing layers spaced apart from each other with a second separation line therebetween;

forming a third separation line by removing a portion of the light-absorbing layers in each unit cell, the third separation line spaced apart from the second separation line;

disposing a silk screen over the light-absorbing layers having the second and third separation lines such that the silk screen corresponds to the third separation line;

after forming the third separation line and disposing the silk screen corresponding to the third separation line, forming a reflection material layer by applying a conductive paste to substantially an entire surface of the substrate excluding the silk screen; and forming reflection electrodes corresponding to the unit cells, respectively, by sintering the reflection material layer.

2. The method according to claim 1, wherein the conductive paste includes a binder of a carbonic polymer and one of aluminum, silver, copper, molybdenum, titanium and cadmium.

3. The method according to claim 1, wherein the reflection material layer is sintering under temperatures of 200 to 500 degrees Celsius.

4. The method according to claim 1, wherein the reflection material layer has viscosity of 500 cp to 50,000 cp.

5. The method according to claim 1, wherein the third separation line has a width of 20 micrometers to 100 micrometers.

6. The method according to claim 1, wherein each of the light-absorbing layers includes a p-type silicon layer, an i-type silicon layer and an n-type silicon layer.

7. A method of manufacturing a thin film solar cell, comprising:

preparing a substrate including first and second unit cells;

forming first and second transparent conductive layers on the substrate and corresponding to the first and second unit cells, respectively, the first and second transparent conductive layers spaced apart from each other;

forming first and second light-absorbing layers on the first and second transparent conductive layers and corresponding to the first and second unit cells, respectively, the first and second light-absorbing layers spaced apart from each other;

forming a separation line by removing a portion of the respective first and second light-absorbing layers in each of the first and second unit cells; and disposing a silk screen over each of the first and second light-absorbing layers having the separation line such that the silk screen corresponds to the separation line in each of the first and second light-absorbing layers; and after forming the separation line and disposing the silk screen corresponding to the separation line, forming first and second reflection electrodes corresponding to the first and second unit cells, respectively, wherein the first and second reflection electrodes are spaced apart from each other by the separation line.

8. The method according to claim 7, wherein forming the first and second reflection electrodes includes applying a conductive paste to form a reflection material layer and then sintering the reflection material layer.

9. The method according to claim 7, wherein the first light-absorbing layer overlaps the first and second transparent conductive layers, and the first reflection electrode overlaps the first and second light-absorbing layers.

* * * * *